United States Patent [19]
Perino

[11] Patent Number: 4,773,722
[45] Date of Patent: Sep. 27, 1988

[54] TWO-WAY COUPLER FOR OPTICAL FIBERS

[75] Inventor: Mauro Perino, Turin, Italy

[73] Assignee: Cselt Centro Studi e Laboratori Telecomunicazioni S.P.A., Turin, Italy

[21] Appl. No.: 554,375

[22] Filed: Nov. 22, 1983

Related U.S. Application Data

[63] Continuation of Ser. No. 274,071, Jun. 16, 1981.

[30] Foreign Application Priority Data

Jun. 17, 1980 [IT] Italy ................. 67939 A/80

[51] Int. Cl.[4] ............................. G02B 6/32
[52] U.S. Cl. ................................ 350/96.18
[58] Field of Search ............ 350/96.18; 250/208, 250/227

[56] References Cited

U.S. PATENT DOCUMENTS

| | | | |
|---|---|---|---|
| 3,657,547 | 4/1972 | Mansfield | 250/208 |
| 3,991,318 | 11/1976 | Duguay | 250/227 |
| 4,025,157 | 5/1977 | Martin . | |
| 4,053,764 | 10/1977 | Sierak et al. | 250/227 |

FOREIGN PATENT DOCUMENTS 2011610 7/1979 United Kingdom .
2034883 6/1980 United Kingdom .

OTHER PUBLICATIONS

"Optical Connector Measurement System" by J. S. Kolodzey et al, publ. Jun. 1979 in IBM Technical Disclosure Bulletin vol. 22, No. 1, pp. 47 and 48.
"High-radiance LEDs operate at 1.3 μm for long-haul optic cable" by Kevin Smith, publ. May 24, 1979 in Electronics International vol. 52, No. 11, pp. 73, 74.

Primary Examiner—William L. Sikes
Assistant Examiner—Robert E. Wise
Attorney, Agent, or Firm—Herbert Dubno

[57] ABSTRACT

Outgoing light signals from a virtual point source are transmitted to a confronting end of an optical fiber via a microlens, whose diameter approximately equals the fiber diameter, axially traversing a center hole of a large-diameter circular photodetector illuminated by incoming light signals from the same fiber end. A focusing lens or objective may be interposed between that fiber end and the photodetector with its microlens to create a field of parallel rays therebetween. The photodetector may be angularly subdivided into a plurality of sectoral portions which are electrically interconnected in series for producing an increased output voltage.

7 Claims, 1 Drawing Sheet

U.S. Patent  Sep. 27, 1988  4,773,722
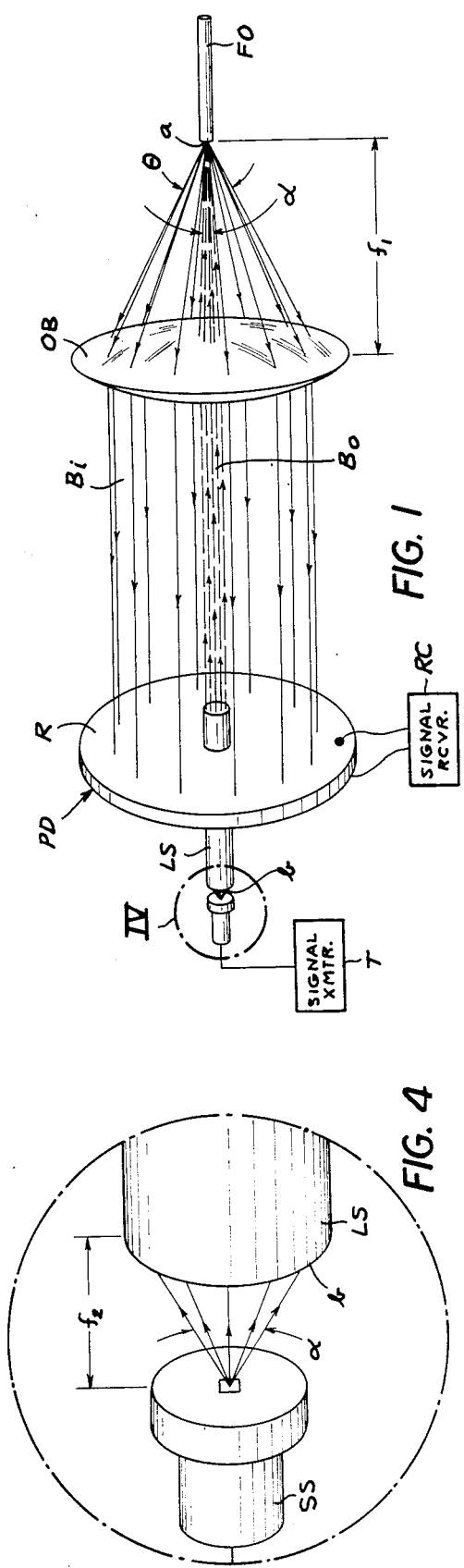
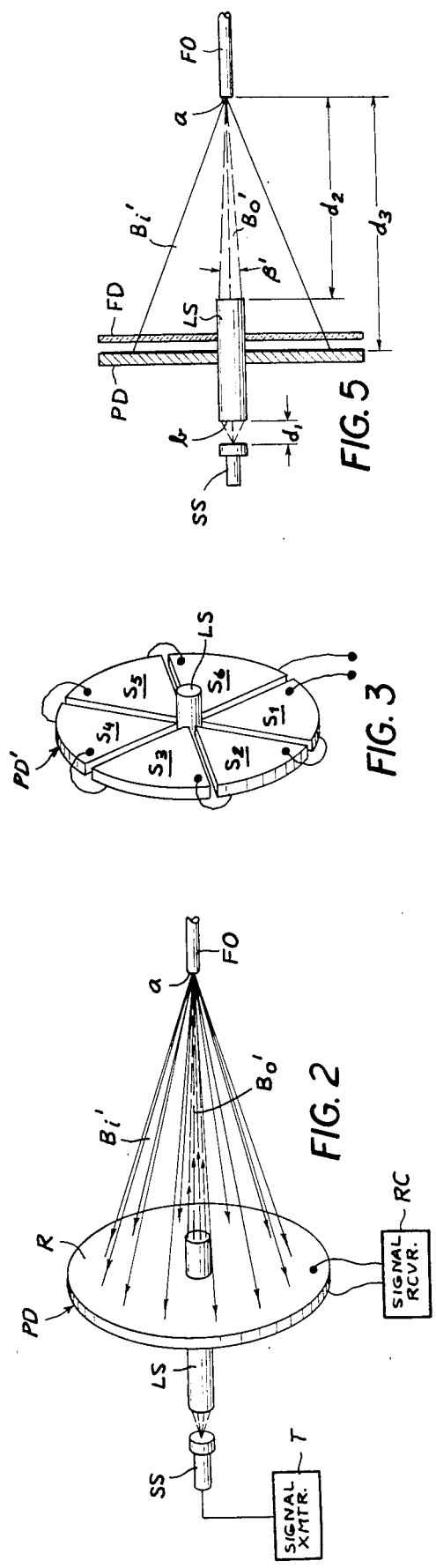

TWO-WAY COUPLER FOR OPTICAL FIBERS

This application is a continuation of application Ser. No. 274,071 filed June 16, 1981.

FIELD OF THE INVENTION

My present invention relates to a two-way coupler coacting with an optical fiber for enabling the simultaneous transmission of outgoing light signals and reception of incoming light signals traversing that fiber.

BACKGROUND OF THE INVENTION

One of the problems encountered in interfacing a signal transmitter and a signal receiver with the same end of an optical fiber is the attenuation undergone by the transmitted and received beams in an optical coupler designed to separate these beams from each other. Such couplers conventionally include semireflective mirrors which act as beam splitters. A system of this type is described, for example, in German Published Specification (Offenlegungsschrift No. 2,546,269; the semireflector of that system is provided with a fully transparent central aperture in a common focus of three converging lenses two of them lying on the fiber axis while the third one lies on a line perpendicular thereto. It is also known to use Y-shaped fiber junctions for beam-splitting purposes.

In all these prior systems the attenuation of the luminous energy is relatively high. Since a collective lens generally introduces a loss of about 1 dB. the successive traverse of two cascaded lenses in a system such as that of the aforementioned German publication accounts for a power loss of about 2 dB which is particularly undesirable in the case of a received beam.

Another drawback of conventional two-way couplers is the limitation imposed by the acceptance angle of the fiber upon the amount of luminous energy that can be transmitted.

OBJECTS OF THE INVENTION

Thus, an object of my present invention is to provide an improved two-way coupler for the purpose set forth which, while effectively separating incoming and outcoming light rays, minimizes their attenuation.

Another object is to provide means in such a coupler for enabling the utilization of a larger portion of the luminous energy emitted by an available light source.

SUMMARY OF THE INVENTION

A coupler according to my invention comprises a photodetector whose receiving surface is substantially larger than the proximal end face of a coacting optical fiber, the receiving surface of this photodetector being perpendicular to the fiber axis and disposed at a predetermined distance from that end face for illumination by incoming light signals. A central hole of the photodetector is traversed by a positively refracting microlens in line with the fiber axis and is illuminated by a vertical point source of outgoing light signals, such as a light-emitting diode or a laser, which is coaxially juxtaposed therewith on the side of the photodetector opposite the coacting fiber.

The microlens should have a diameter which is a small fraction of the diameter of the area of the receiving surface illuminated by the incoming light signals, and which therefore ought to be on the order of magnitude of the fiber diameter. Advantageously. the microlens is conventionally constituted by an optical-fiber section of the SELFOC type whose refractive index varies progressively in radial direction, e.g. as taught in British patent No. 1,275,094. The microlens and the photodetector may be separated from the coacting fiber by optical focusing means, in the form of one or more lenses, serving to establish a so-called telecentric field therebetween in which the rays of the incoming and outgoing beams are substantially parallel to the axis. Even with such interposition, the incoming beam only undergoes an attenuation of about 1 dB. The second or outgoing beam, whether telecentric or converging, has a maximum diameter not exceeding that of the microlens as will become apparent hereinafter.

BRIEF DESCRIPTION OF THE DRAWING

The above and other features of my invention will now be described in detail with reference to the accompanying drawing in which:

FIG. 1 is a diagrammatic perspective view of a coupler embodying my invention;

FIG. 2 is a view similar to FIG. 1 showing another embodiment;

FIG. 3 is a perspective view of a modified photodetector adapted to be used in either of the two embodiments shown in FIGS. 1 and 2;

FIG. 4 is an enlarged view of a detail indicated at IV in FIG. 1; and

FIG. 5 is a diagrammatic side view of the system of FIG. 2 provided with a color filter.

SPECIFIC DESCRIPTION

In FIG. 1 I have shown part of an optica fiber FO with a proximal end face a serving for the simultaneous transmission and reception of outgoing and incoming light signals. End face a lies in a focal plane of an optical objective OB, here shown as a single lens, having a focal length $f_1$.

This focal length is so chosen, with reference to the acceptance angle $\theta$ of the fiber, that the incoming light rays substantially fully illuminate the lens OB. The light rays are thereby focused into a telecentric beam $B_i$ trained upon a receiving surface R of a photodetector PD. The latter, shown as a disk whose diameter is many times greater than that of fiber FO, works into a conventional signal receiver RC. A central hole in photodeector PD, of a diameter only slightly greater than the diameter of the fiber FO, is traversed by a microlens LS of the SELFOC type. i.e. a fiber section whose refractive index diminishes progressively from the axis outward according to the formula $$n = n_O(1 - kr^2)$$

where $n_O$ is the index along the axis, r is the radial distance from the axis and k is a positive constant. Microlens LS, as seen in the drawing, has a diameter slightly exceeding that of fiber FO.

A conventional signal transmitter T modulates a virtually punctiform light source SS, preferably a semiconductor laser, which illuminates an input end b of microlens LS remote from focusing lens OB and fiber FO. As more clearly illustrated in FIG. 4, source SS is separated from input end b by the focal length $f_2$ of the microlens; the light cone illuminating the microlens defines an emission angle $\alpha$ exceeding the acceptance angle $\theta$ of fiber FO, thanks to the larger numerical aperture of the microlens compared with that of the fiber. The outgoing light rays from source SS are thus converted into another telecentric beam $B_O$, of a diameter substantially smaller than that of beam $B_i$, which reaches a limited paraxial area of lens OB and is focused by the latter upon the center of fiber face a; the converging final part of beam $B_o$ has a vertex angle $\beta$ well within the acceptance angle $\theta$ of the fiber.

FIG. 2 shows another coupler according to my invention which differs from that of FIG. 1 mainly by the omission of the focusing objective or lens OB. In this instance (see also FIG. 5) the source SS is separated from the input end b of microlens LS by a distance $d_1$ which is somewhat larger than the focal length $f_2$ of the microlens whereby the outgoing rays are concentrated in a converging beam $B_o$ enveloped by a diverging incoming beam $B_i'$. The distance $d_2$ of the output end of microlens LS from the fiber face a is conjugate with distance $d_1$ so that beam $B_o'$ is pointed at the center of face a. The increased distance $d_1$ entails a slight loss of luminous energy from source SS; on the other hand, the attenuation of approximately 1 dB undergone by the incoming and outgoing beams in the system of FIG. 1 is eliminated. With microlens LS axially slidable within the center hole of photodetector PD, this detector can be readily positioned at a suitable distance $d_3$ from fiber face a at which its receiving surface R will be substantially fully illuminated by the incoming beam $B_i'$. Here, again, the outgoing beam $B_o'$ converges at a vertex angle $\beta'$ which is substantially less than the acceptance angle $\theta$.

As will be apparent, the luminous energy of the incoming beam $B_i$ or $B_i'$ received by photodetector PD is diminished by the presence of microlens LS in proportion to the ratio of its cross-sectional area to the area of receiving surface R.

In a practical embodiment, using commercially available components, this ratio may be about 1:12.5 corresponding to a loss of about 0.3 dB. Even with an attenuation of approximately 1 dB introduced by the focusing means OB of FIG. 1, the overall power loss of the incoming beam will be only about 1.3 dB. Microlens LS introduces but negligible attenuation in the outgoing beam.

In order to avoid any possible interference between incoming and back-scattered outgoing light rays, the two signals may use light of different wavelengths. Back-scattered rays of the outgoing wavelength may be intercepted, ahead of the photodetector PD, by an annular filter disk FD surrounding the microlens LS and juxtaposed with receiving surface R as illustrated in FIG. 5; such a filter disk may, of course also be used in the system of FIG. 1 in order to provide a frequency-selective coupler.

Photodetector PD may operate either in the photoconductive region (with reverse biasing) or in the photovoltaic region (without biasing). In either case, the output voltage of a single-cell photodetector will generally not exceed a fraction of a volt when the incoming luminous energy is derived from a source such as a laser with a power of less than 10 mW illuminating the remote end of fiber FO. Since for certain remote-control purposes an output signal of several volts may be required, the detector PD of FIGS. 1 and 2 may be replaced by a modified detector PD, of the same diameter which has been shown in FIG. 3 and which is angularly subdivided into a multiplicity of sectoral portions $S_1$–$S_6$ that are electrically interconnected in series. These portions should have substantially the same voltage/current response inasmuch is the overall efficiency of photodetector PD' is determined by the least-efficient member of the series. The number of sectors will, of course, depend on the available light energy and on the output voltage required.

I claim:

1. A two-way coupler coacting with an optical fiber for the simultaneous transmission of outgoing light signals and reception of incoming light signals traversing the coacting fiber, comprising:

a photodector with a receiving surface substantially larger than a proximal end face of the coacting fiber, said photodetector being disposed with its receiving surface perpendicular to the fiber axis at a predetermined distance from said end face for illumination by incoming light signals forming an at least partly diverging first beam centered on said axis;

a positively refracting microlens in line with the fiber axis traversing a central hole of said photodetector occupying a small fraction of the area illuminated by said first beam; and a virtual point source of outgoing light signals coaxially juxtaposed with said microlens on the side of said photodetector opposite said coacting fiber for projecting upon the center of said end face a second beam centered on said axis with a maximum diameter not substantially exceeding the diameter of said microlens, the microlens diameter being on the order of magnitude of the coacting fiber, said source being separated from said microlens by a first distance exceeding the focal length of said microlens, the latter being spaced from said end face by a second distance conjugate to said first distance whereby outgoing light signals are transmitted to the coacting fiber in a beam converging at the center of said end face, said photodetector being spaced from said end face by a third distance sufficient to let a diverging beam of incoming light signals from said end face illuminate an area of said receiving surface substantially exceeding the area of said central hole, said microlens being axially shiftable relatively to said photodetector.

2. A coupler as defined in claim 1 wherein said microlens is an optical-fiber section with a refractive index varying progressively in a radial direction.

3. A coupler as defined in claim 1 or 2, further comprising optical focusing means interposed between said photodetector and said end face, the latter being disposed substantially in a focal plane of said focusing means whereby said first beam consists of substantially parallel rays between said focusing means and said photodetector.

4. A coupler as defined in claim 3 wherein said source is separated from said microlens by a distance substantially equaling the focal lenght of said microlens whereby said second beam consists of substantially parallel light rays between said focusing means and said microlens.

5. A coupler as defined in claim 1 or 2 wherein said photodetector is a circular disk angularly subdivided into a multiplicity of substantially identical sectoral portions electrically connected in series with one another.

6. A coupler as defined in claim 1 or 2 wherein said microlens has a numerical aperture exceeding that of said coating fiber whereby said microlens is illuminable by said source with a light cone having a vertex angle greater than the acceptance angle of the coacting fiber.

7. A coupler as defined in claim 1 or 2 wherein said source operates with luminous radiation of a frequency differing from that of said incoming light rays, further comprising an annular filter disk surrounding said microlens adjacent said receiving surface for selectively blocking light having the operating frequency of said source.

* * * * *